(12) United States Patent
Myers et al.

(10) Patent No.: US 7,795,726 B2
(45) Date of Patent: Sep. 14, 2010

(54) LIQUID COOLED POWER ELECTRONIC CIRCUIT COMPRISING A STACKED ARRAY OF DIRECTLY COOLED SEMICONDUCTOR CHIPS

(75) Inventors: Bruce A. Myers, Kokomo, IN (US); Eric A. Brauer, Avon, IN (US)

(73) Assignee: Delphi Technologies, Inc., Troy, MI (US)

( * ) Notice: Subject to any disclaimer, the term of this patent is extended or adjusted under 35 U.S.C. 154(b) by 586 days.

(21) Appl. No.: 11/799,925

(22) Filed: May 3, 2007

(65) Prior Publication Data
US 2008/0272484 A1 Nov. 6, 2008

(51) Int. Cl.
*H01L 23/34* (2006.01)

(52) U.S. Cl. ........................ 257/714; 257/712; 257/723; 257/686; 257/713; 257/E23.098

(58) Field of Classification Search ................. 257/714, 257/E23.098, 712, 723, 686, 713
See application file for complete search history.

(56) References Cited

U.S. PATENT DOCUMENTS

| | | | | |
|---|---|---|---|---|
| 5,532,512 A | * | 7/1996 | Fillion et al. | 257/686 |
| 5,633,530 A | * | 5/1997 | Hsu | 257/685 |
| 6,514,794 B2 | * | 2/2003 | Haba et al. | 438/109 |
| 6,717,812 B1 | * | 4/2004 | Pinjala et al. | 361/699 |
| 7,615,854 B2 | * | 11/2009 | Montgomery | 257/678 |
| 2005/0067694 A1 | | 3/2005 | Pon et al. | |
| 2006/0022334 A1 | | 2/2006 | Myers et al. | |
| 2006/0034052 A1 | | 2/2006 | Chang et al. | |
| 2006/0291164 A1 | | 12/2006 | Myers et al. | |
| 2007/0063337 A1 | | 3/2007 | Schubert et al. | |
| 2007/0290311 A1 | * | 12/2007 | Hauenstein | 257/685 |

OTHER PUBLICATIONS

EP Search Report dated Jul. 3, 2008.

* cited by examiner

*Primary Examiner*—Lynne A Gurley
*Assistant Examiner*—Junghwa M Im
(74) *Attorney, Agent, or Firm*—Jimmy L. Funke

(57) ABSTRACT

A stacked array of channeled semiconductor chips defining a power electronic circuit is mounted in a sealed container provided with inlet and outlet passages for liquid coolant. Leadframe terminals supported by the container engage selected terminals of the semiconductor chips and form leads for mounting the container on a circuit board having electrical and fluid interconnects.

7 Claims, 5 Drawing Sheets

LIQUID COOLED POWER ELECTRONIC CIRCUIT COMPRISING A STACKED ARRAY OF DIRECTLY COOLED SEMICONDUCTOR CHIPS

TECHNICAL FIELD

The present invention relates to liquid cooling of power semiconductor electronics, and more particularly to a liquid cooled power electronic circuit defined by a stack of electrically interconnected integrated circuit chips.

BACKGROUND OF THE INVENTION

Various types of cooling mechanisms can be used to remove waste heat from high power semiconductor devices such as power FETs and IGBTs. In cases where the waste heat and/or the ambient temperature are very high, the power device packages can be mounted on a liquid-cooled heat exchanger or a cold plate through which liquid coolant is circulated. The heat transfer can be significantly improved by bringing the liquid coolant directly into contact with the semiconductor chip (die), as shown in the Patent Application Publication Nos. 2006/0022334; 2006/0034052; 2006/0291164; and 2007/0063337, all assigned to Delphi Technologies, Inc. As described in these patent documents, a major surface of the semiconductor chip (say, the drain terminal of a power FET) can be undercut to define an array of fluid conducting channels through the bulk region of the chip, and the chip can be packaged so that some or all of the circulating fluid flows through the channels to remove heat from the chip. As described in the aforementioned Publication No. 2006/0022334, for example, the direct die cooling approach can be implemented on a modular or stand-alone basis by packaging a channelled semiconductor chip in a liquid cooled container, and mounting the container on a circuit board with both electrical and fluid interconnects.

SUMMARY OF THE INVENTION

The present invention is directed to an improved direct die cooling arrangement in which a stacked array of channeled semiconductor chips is mounted in a sealed container provided with inlet and outlet passages for liquid coolant. Juxtaposed terminals of the semiconductor chips are electrically joined to form a power electronic circuit. Leadframe terminals supported by the container engage exposed terminals of the semiconductor chips and form leads for mounting the container on a circuit board having electrical and fluid interconnects.

DESCRIPTION OF THE PREFERRED EMBODIMENT

In general, the present invention is directed to a semiconductor packaging approach in which a plurality of semiconductor power chips (die) are interconnected by stacking in a liquid cooled container to form a direct die cooled power electronic circuit. The invention is primarily disclosed in the context of power field-effect transistors (FETs) configured to form an H-bridge or ½-H-Bridge power transistor circuit, but it will be recognized that the disclosed approach equally applies to other semiconductor power devices and other power electronic circuits.

Figure 1A:
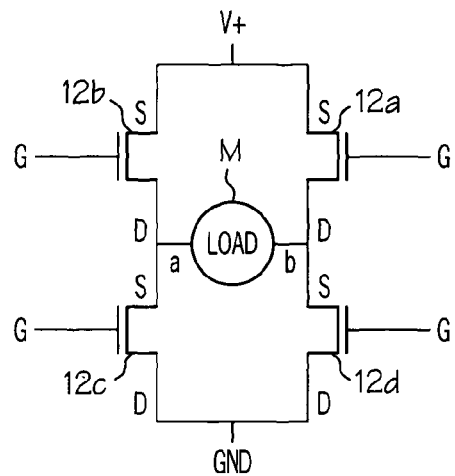
FIG. 1A depicts an H-Bridge transistor circuit.
Figure 1B:
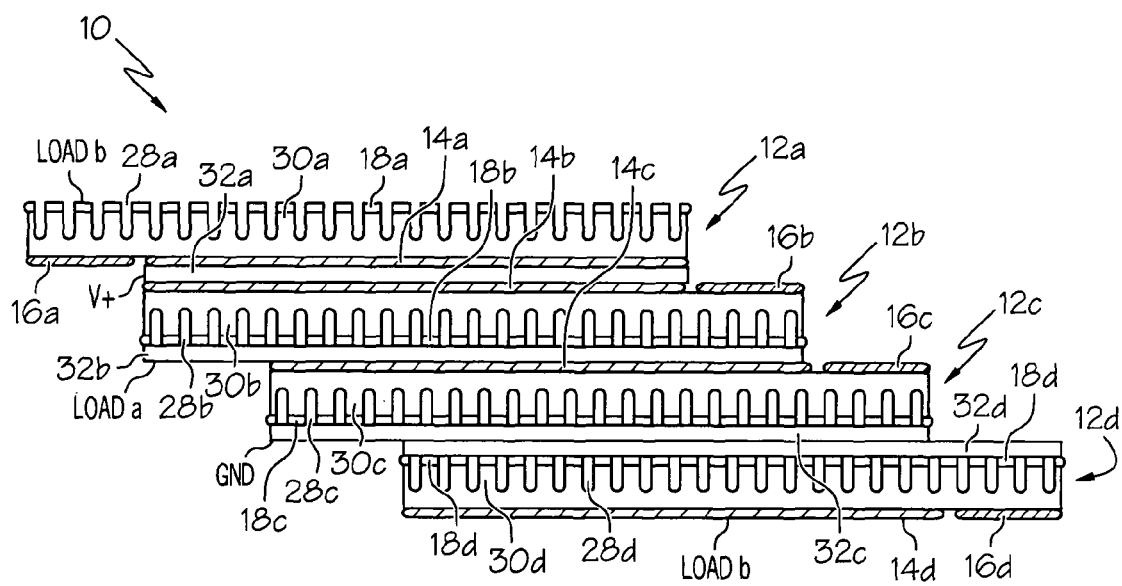
FIG. 1B is a side view of a stacked semiconductor die assembly for effectuating the circuit of FIG. 1A according to this invention.

FIGS. 1A and 1B respectively illustrate an H-Bridge transistor circuit and a stacked assembly or array of power-FET chips 12a-12d for effectuating the H-Bridge circuit. Referring to FIG. 1A, the letter M designates a two-terminal (a and b) electrical load such as a DC motor. The FETs 12b and 12c respectively couple load terminal a to power (V+) and ground (GND); and the FETs 12a and 12d respectively couple load terminal b to power (V+) and ground (GND). The source, drain and gate terminals of FETs 12a-12d are designated by the letters S, D and G, respectively. In operation, load current in a first direction (a-to-b) is established by turning on FETs 12b and 12d with FETs 12a and 12c turned off; and load current in the opposite direction (b-to-a) is established by turning on FETs 12a and 12c with FETs 12b and 12d turned off.

In FIG. 1B, the reference numeral 10 generally designates a stacked assembly of four power-FET chips 12a-12d corresponding to the four FETs 12a-12d in the circuit diagram of FIG. 1A. For convenience of description, the letters a-d are appended to the reference numerals designating various elements of the FET chips 12a-12d. Each FET 12a-12d has a first major surface on which are formed the source and gate terminals 14a-14d and 16a-16d, and a second major surface on which is formed the drain terminal 18a-18d. In each case, the drain terminal 18a-18d and the underlying inactive bulk material of the FET are partially recessed by an etching or sawing process to define a number of parallel channels 28a-28d separated by intervening walls 30a-30d. Additionally, each of the FET chips 12a-12d has a metal interposer sheet 32a-32d of copper or Alloy 42 that is preferably attached by soldering at the wafer level (i.e., prior to die singulation). The metal interposer sheets 32a-32d facilitate electrically testing of the singulated transistor chips 12a-12d, and chip-to-chip interconnections when they are stacked and electrically joined to define a power electronic circuit.

When the transistor chips 12a-12d are stacked as shown in FIG. 1B, the juxtaposed terminals and interposer sheets are soldered together; i.e., interposer sheet 32a is soldered to the source terminal 14b, interposer sheet 32b is soldered to source terminal 14c, and interposer sheet 32c is soldered to interposer sheet 32d. The lateral staggering of the chips 12a-12d leaves the gate terminals 16a-16d exposed, and affords electrical connection to selected ones of the source terminals 14a-14d and drain terminals 18a-18d.

It can be demonstrated that the assembly 10 effectuates the H-Bridge circuit of FIG. 1A. Starting at the top of the assembly 10, load terminal b is coupled to drain 18a, V+ is coupled to sources 14a and 14b, load terminal a is coupled to drain 18b and source 14c, GND is coupled to drains 18c and 18d, and load terminal b is coupled to source 14d. As explained below in reference to FIGS. 3-4, the liquid cooled container into which the stacked assembly 10 is installed includes leadframe terminals for making the indicated connections, as well as the connections to gate terminals 16a-16d. Optionally, one or more of the interposer sheets 32a-32d can extend laterally beyond the outline of the respective transistor chips 12a-12d to facilitate electrical interconnections in the liquid cooled package.

Figure 2A:
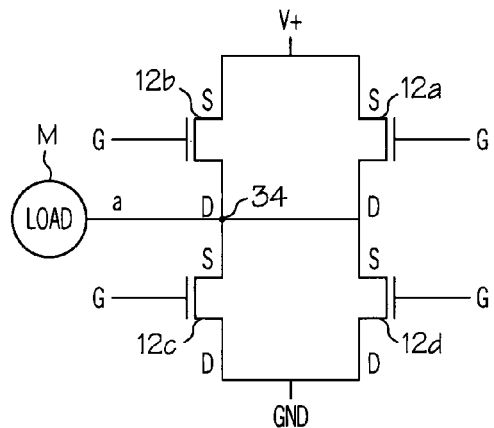
FIG. 2A depicts a ½-H-Bridge transistor circuit.
Figure 2B:
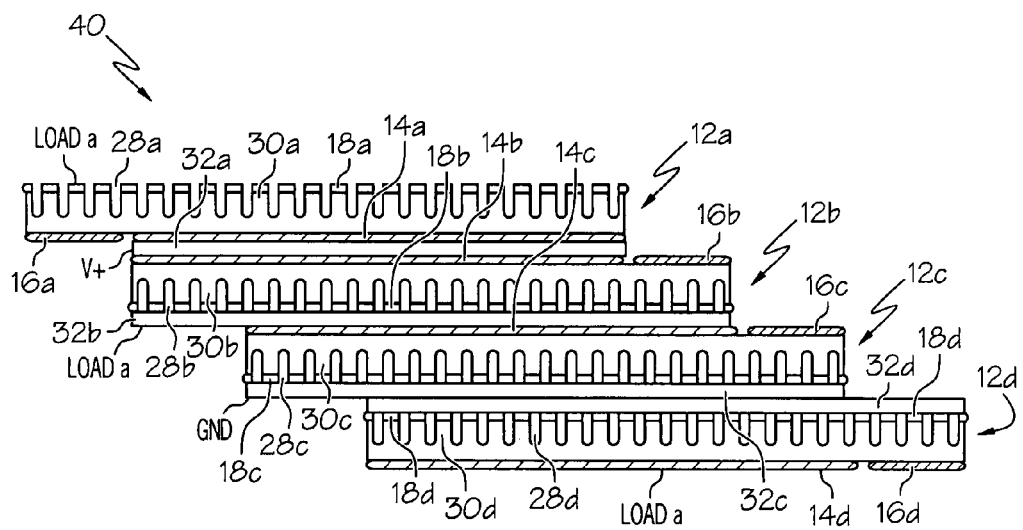
FIG. 2B is a side view of a stacked semiconductor die assembly for effectuating the circuit of FIG. 2A according to this invention.

FIGS. 2A and 2B respectively illustrate a ½-H-Bridge transistor circuit and a stacked assembly of power-FET chips 12a-12d for effectuating the ½-H-Bridge circuit. Referring to FIG. 2A, the letter M designates a two-terminal electrical load such as a DC motor, the "a" terminal of which is coupled to the node 34 of the bridge circuit. The FETs 12a and 12b are connected in parallel, and couple the node 34 to power (V+). Similarly, the FETs 12c and 12d are connected in parallel, and couple the node 34 to ground (GND). As in FIG. 1A, the source, drain and gate terminals of FETs 12a-12d are designated by the letters S, D and G, respectively. In operation, FETs 12a and 12b are turned on to connect the load terminal to V+; alternately, FETs 12c and 12d are turned on to connect the load terminal to GND.

In FIG. 2B, the reference numeral 40 generally designates a stacked assembly of four power-FET chips 12a-12d corresponding to the four FETs 12a-12d in the circuit diagram of FIG. 2A. As in FIG. 1B, the letters a-d are appended to the reference numerals designating various elements of the FET chips 12a-12d. Also, each FET 12a-12d is provided with source and gate terminals 14a-14d and 16a-16d, channeled drain terminals 18a-18d, and a metal interposer sheet 32a-32d. The chip-to-chip interconnections in the assembly 40 are the same as in the assembly 10 of FIG. 1B, and are not described again here. In the assembly 40, however, the load terminal a is connected to the drain terminals 18a and 18b and the source terminals 14c and 14d.

Figure 3:
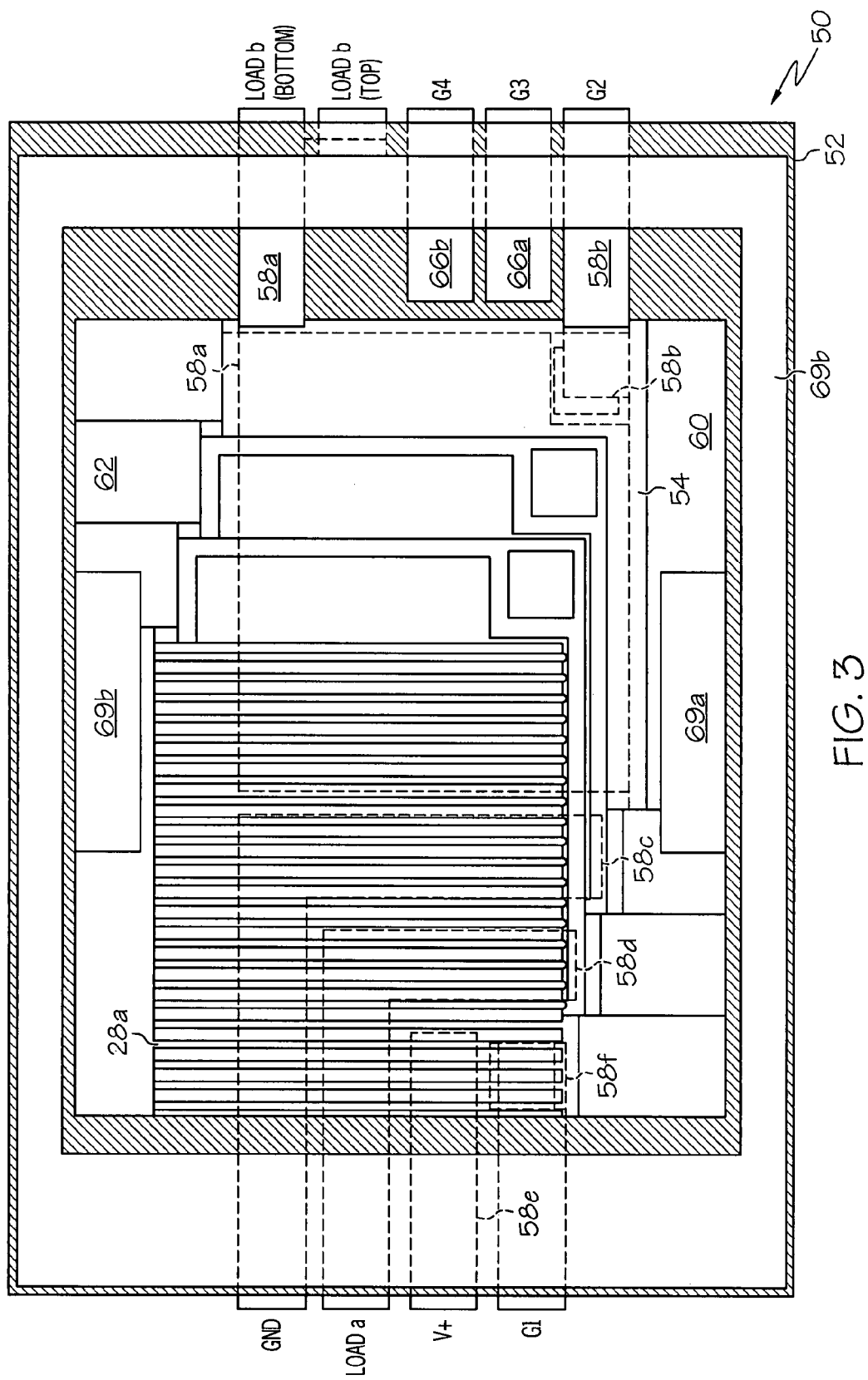
FIG. 3 is a top view of a liquid cooled power semiconductor circuit package based on the stacked semiconductor die assembly of FIG. 1B, but with the cover of the package removed.
Figure 4:
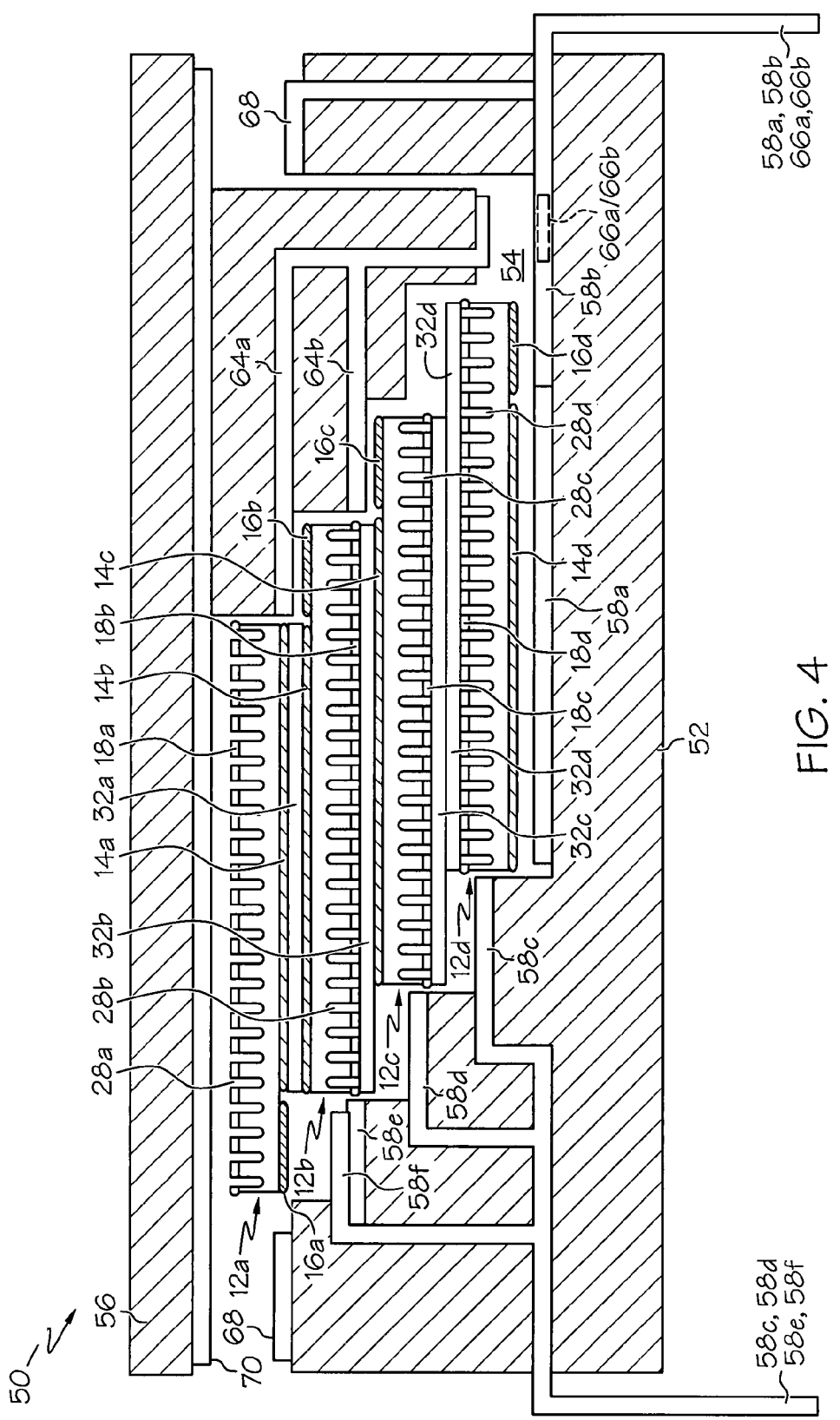
FIG. 4 is an exploded pseudo-cross-sectional diagram of the liquid cooled power semiconductor circuit package of FIG. 3.

FIGS. 3-4 illustrate a liquid cooled container 50 for housing a stacked assembly of transistor chips 10, 40 such as depicted in FIGS. 1B and 2B. The container comprises a molded base 52 that is recessed to form a fluid chamber 54 in which the transistor chips 12a-12d are received, and a molded cover 56 that closes and seals the chamber 54. To this end, the base 52 is provided with a perimeter leadframe element 68 forming a complete path of exposed metal atop the walls bounding the chamber 54 (as well as a package lead), and the leadframe element 68 is soldered to a planar conductor 70 formed on the inboard face of cover 56 to seal the chamber 54.

The floor of the chamber 54 is vertically tiered as seen in FIG. 4 to support the downward-facing surfaces of the chips 12a-12d, and a set of leadframe terminals 58a-58f insert-molded in the base 52 have exposed surfaces in the floor of chamber 54 that make electrical contact with selected downward-facing terminals of the chip assembly 10, 40. As seen in FIG. 3, the sidewalls 60 and 62 on either side of the vertically tiered floor of chamber 54 are horizontally tiered so that the chips 12a-12d individually nest in the chamber 54 with the proper amount of horizontal staggering. The transistor chips 12a-12d may be stacked and interconnected as shown in FIGS. 1B and 2B using an external fixture (not shown) and then placed in the chamber 54, or they may be stacked by placing them individually in chamber 54. Referring to FIG. 4, the inboard face of cover 56 is vertically tiered to match the profile of the chip assembly 10, 40, and a set of leadframe terminals 64a-64b insert-molded in the cover 56 have exposed surfaces that make electrical contact with selected upward-facing terminals of the chip assembly 10, 40. The leadframe terminals 64a and 64b of cover 56 also engage a set of leadframe terminals 66a and 66b in the base 52 so that the package leads all extend out of the base 52.

The sidewalls 60 and 62 of base 52 position the stacked chip assembly 10 approximately in the middle of the chamber 54, as seen in FIG. 3, with the channels 28a-28d of each chip 12a-12d running laterally between the sidewalls 60 and 62. A first fluid passage 69a formed in the sidewall 60 admits liquid coolant into the chamber 54. The coolant passes through the channels 28a-28d of chips 12a-12d, and then exits the chamber 54 through a second fluid passage 69b formed in the sidewall 62.

The leadframe terminals 58a-58f and 64a-64b of the illustrated container 50 are configured for the H-Bridge chip assembly 10; a somewhat different leadframe configuration would be required for the ½-H-Bridge chip assembly 40. In the illustrated configuration, the base leadframe terminals 58a, 58b, 58c, 58d, 58e and 58f respectively engage source 14d (load terminal b), gate 16d, drain 18c (GND), drain 18b (load terminal a), source 14a (V+) and gate 16a. The cover leadframe terminals 64a and 64b respectively engage gate 16b and gate 16c, and planar conductor 70 formed on the inboard face of cover 56 engages drain 18a (load terminal b). The planar conductor 70 is joined to the perimeter leadframe terminal 68 of base 52 as mentioned above, and the terminal 68 is joined to the leadframe terminal 58a since both are coupled to load terminal b. Once assembled, the various electrical and sealing connections are formed with normal solder in a reducing atmosphere, or with epoxy-based flux solder in a reflow process.

Figure 5A:
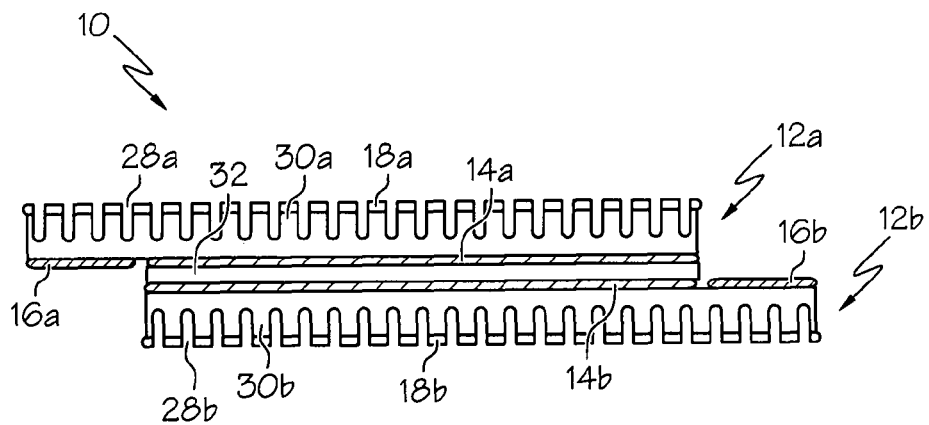
FIGS. 5A, 5B and 5C respectively depict first, second and third configurations of a two-die stacked die assembly.
Figure 5B:
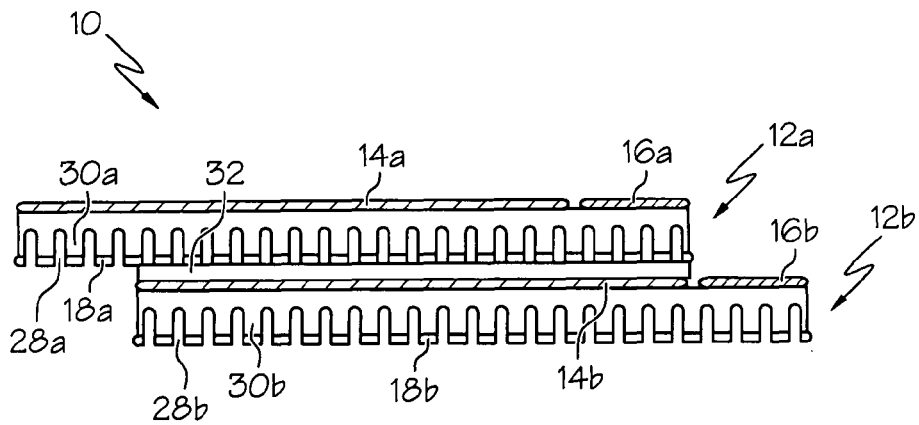
Figure 5C:
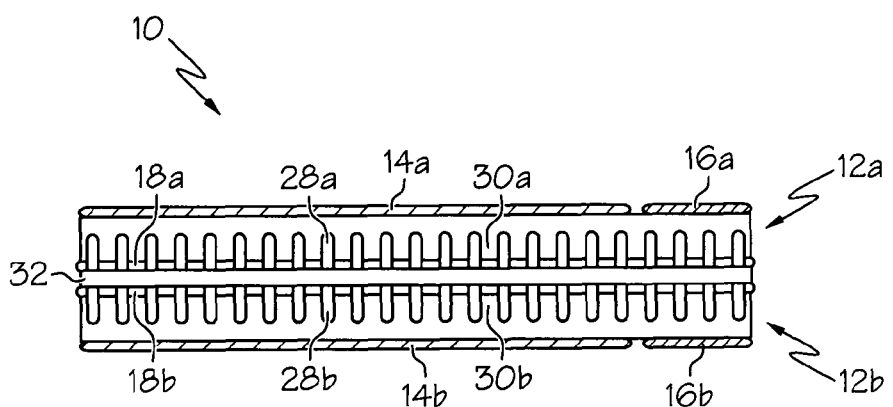

FIGS. 5A-5C simply demonstrate different possible chip-to-chip stack configurations that can be packaged as show or in combination with other chips. In each case, the illustrated interposer sheet 32 can be soldered to either chip 12a or 12b. FIG. 5A illustrates a stacked source-to-source transistor circuit, where the horizontal staggering of chips 12a and 12b allows bottom-side access to gate 16a and top-side access to gate 16b. The drains 18a and 18b are also accessible, and the interposer 32 can be extended transverse to the plane of the drawing to afford electrical access to the interconnected sources 14a and 14b. FIG. 5B illustrates a stacked drain-to-source transistor circuit, where source 14a and drain 18b are accessible, and the horizontal staggering of chips 12a and 12b allows top-side access to both gates 16a and 16b, as well as the interconnected drain 18a and source 14b. Finally, FIG. 5C demonstrates that in a stacked drain-to-drain transistor circuit, access to gates 16a and 16b is achieved without horizontal staggering. Similar to the configuration of FIG. 5A, interposer 32 can be extended transversely to afford electrical access to the interconnected drains 18a and 18b.

In summary, the present invention provides a cost effective and space-efficient way of forming power electronic circuits with direct die liquid cooling by installing a stacked assembly of interconnected semiconductor chips in a liquid cooled container. While described in reference to the illustrated embodiments, it is expected that numerous modifications and variations in addition to those mentioned herein will occur to those skilled in the art. For example, the interposer sheets 32 can be formed of a dielectric material, or a combination of dielectric and conductive material, to electrically isolate different circuits in an assembly of semiconductor chips, the number of stacked semiconductor chips in a given package may be different than shown, The leadframe terminals of container 50 and cover 56 can be over-molded instead of insert-molded, or fabricated from multi-layer circuit boards. Also, the layout and profile of the chip channels may be different than shown, the number and/or shape of the fluid passages, as well as the number of electrical interconnects per package, may be different than shown, and so on. Accordingly, it is intended that the invention not be limited to the disclosed embodiment, but that it have the full scope permitted by the language of the following claims.

The invention claimed is:

1. A liquid cooled power electronic circuit, comprising:
    a sealed container having a chamber with inlet and outlet passages for receiving and exhausting liquid coolant; and
    a stacked array of power semiconductor die disposed in the chamber, each such power semiconductor die having upper and lower faces on which are formed one or more electrical terminals, where the power semiconductor die are directly stacked one on another with electrical terminals of vertically adjacent power semiconductor die being juxtaposed and soldered to one another to form said power electronic circuit, the power semiconductor die are laterally staggered so that selected electrical terminals of said power semiconductor die are exposed, a floor of the chamber is vertically tiered to support the laterally staggered power semiconductor die, the chamber includes first and second sidewalls laterally bounding the vertically tiered floor of said chamber, and said first and second sidewalls are laterally staggered to match the lateral staggering of said power semiconductor die to ensure a correct orientation of said stacked array of power semiconductor die in said chamber.

2. The liquid cooled power electronic circuit of claim 1, where:
    one or more of said power semiconductor die include first and second terminals formed on a single face thereof, and the power semiconductor die are laterally staggered such that the first terminal is juxtaposed and soldered to a terminal of a vertically adjacent power semiconductor die, but the second terminal is exposed.

3. The liquid cooled power electronic circuit of claim 1, where:
    a set of leadframe elements supported on the vertical tiers of said floor engage and are soldered to exposed electrical terminals formed on the lower faces of said power semiconductor die.

4. The liquid cooled power electronic circuit of claim 1, where:
    at least one of the upper and lower faces of each power semiconductor die is channeled, and the power semiconductor die are each oriented so that the channels conduct liquid coolant between the inlet and outlet passages.

5. The liquid cooled power electronic circuit of claim 1, where:
    said container includes a base and top sealed to said base;
    said base includes a first set of exposed leadframe elements that engage and are soldered to exposed electrical terminals formed on the lower faces of said power semiconductor die; and
    said top includes a second set of exposed leadframe elements that engage and are soldered to exposed electrical terminals formed on exposed upper faces of said power semiconductor die.

6. The liquid cooled power electronic circuit of claim 1, where:
    the stacked array of power semiconductor die includes electrically conductive interposer sheets disposed between and soldered to said juxtaposed electrical terminals.

7. The liquid cooled power electronic circuit of claim 1, where:
    said power semiconductor die are transistors, and said power electronic circuit is an H-Bridge or a ½-H-Bridge.

* * * * *